United States Patent
Hung et al.

(10) Patent No.: US 7,106,623 B2
(45) Date of Patent: Sep. 12, 2006

(54) PHASE-CHANGE MULTI-LEVEL CELL AND OPERATING METHOD THEREOF

(75) Inventors: Jen-Ren Hung, Hsinchu (TW);
Erh-Kun Lai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/907,889

(22) Filed: Apr. 20, 2005

(65) Prior Publication Data
US 2006/0145135 A1    Jul. 6, 2006

(30) Foreign Application Priority Data
Jan. 3, 2005  (TW) .............................. 94100030 A

(51) Int. Cl.
*G11C 11/00* (2006.01)

(52) U.S. Cl. ...................................... 365/163; 365/148
(58) Field of Classification Search ................ 365/163, 365/148, 113, 185.03
See application file for complete search history.

(56) References Cited

U.S. PATENT DOCUMENTS

| | | | | |
|---|---|---|---|---|
| 4,225,946 | A | * | 9/1980 | Neale et al. ................. 365/163 |
| 5,912,839 | A | * | 6/1999 | Ovshinsky et al. ..... 365/185.03 |
| 6,750,469 | B1 | | 6/2004 | Ichihara et al. ................. 257/2 |
| 6,757,190 | B1 | | 6/2004 | Lowrey ...................... 365/163 |
| 6,759,267 | B1 | | 7/2004 | Chen .......................... 438/95 |
| 6,813,177 | B1 | * | 11/2004 | Lowrey et al. ............. 365/148 |

* cited by examiner

*Primary Examiner*—Anh Phung
(74) *Attorney, Agent, or Firm*—Jianq Chyun IP Office

(57) ABSTRACT

A phase-change multi-level memory cell is described, including a semiconductor substrate, a gate structure, two S/D regions, and two phase-change storing units electrically connected to the two S/D regions respectively. One phase-change storing unit can be programmed to one of many phases having different electrical resistances, and combination variations of the phases of the two phase-change storing units generate different read currents corresponding to $2^n$ n-bit data values ($n \geq 2$). To program the cell, the phase of each phase-change storing unit is changed to one of the many phases mentioned above, so that the phase combination of the two phase-change storing units corresponds to a predetermined data value. In addition, when reading the memory cell, the read current is measured to obtain the data value stored.

13 Claims, 2 Drawing Sheets

PHASE-CHANGE MULTI-LEVEL CELL AND OPERATING METHOD THEREOF

CROSS-REFERENCE TO RELATED APPLICATION

This application claims the priority benefit of Taiwan application serial no. 94100030, filed on Jan. 3, 2005. All disclosure of the Taiwan application is incorporated herein by reference.

BACKGROUND OF THE INVENTION

1. Field of the Invention

The present invention relates in general to a non-volatile memory (NVM) device and operation method thereof. More specifically, the present invention relates to a phase-change non-volatile multi-level cell (MLC) and operation method thereof.

2. Description of Related Art

Conventionally, an electrically programmable non-volatile memory uses its floating gate to store electrons capable of representing information, and one memory cell usually has only one floating gate. The floating gate can stores data of 1 bit since the floating gate is made of conductive material such as polysilicon, etc. Therefore, such memory cell cannot perform a multi-level mode operation.

In addition, a phase-change non-volatile memory is developed in recent years. Data is stored by using different resistant properties at different phases of the conductive phase-change material. For example, U.S. Pat. No. 6,750,469 discloses a phase-change non-volatile storing device and driving circuit thereof, U.S. Pat. No. 6,759,267 discloses a method for making a phase-change non-volatile memory, and U.S. Pat. No. 6,757,190 discloses a single-level metal memory cell with a capping layer made of chalcogenide material.

However, the aforementioned phase-change non-volatile memory cells can only perform an operation of single-level (single bit) mode, and is not able to execute a multi-level mode operation.

SUMMARY OF THE INVENTION

According to the foregoing description, an object of this invention is to provide a phase-change multi-level memory cell, capable of being operated in a multi-level mode without increasing an area of a memory array.

Another object of the present invention is to provide a method for operating the phase-change multi-level memory cell of the present invention.

According to the object mentioned above, the present invention provides a phase-change multi-level memory cell. The phase-change multi-level memory cell comprises a semiconductor substrate, a gate structure, two source/drain regions and two phase-change storing units electrically connected to the two source/drain regions, respectively. The gate structure is located on the semiconductor substrate. The two source/drain regions are located at two sides of the gate structure within the semiconductor substrate. Any one of the phase-change storing units can be programmed to one of many phases with different resistances, and a combination of the phases of the phase-change storing units generates different read currents corresponding to $2^n$ n-bit data values ($n \geq 2$).

The present invention further provides a method for operating the aforementioned phase-change multi-level memory cell. When programming the phase-change multi-level memory cell, the two phase-change storing units are set to one of the many phases mentioned above, so that a combination of the phases of the phase-change storing units corresponds to a predetermined data value. When reading the phase-change multi-level memory cell, a memory cell current flowing through the memory cell is measured to obtain the data value stored.

Since the multi-level memory cell of the present invention uses the combination variations of the phases/resistances of the two phase-change storing units to change the body effect and the read current of the memory cell and each phase-change storing unit has varying phases/resistances, one memory cell can store data values having at least two bits. The data storage density is at least twice of that in the conventional single-level phase-change memory cell.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings.

DESCRIPTION OF THE EMBODIMENT

Figure 1:
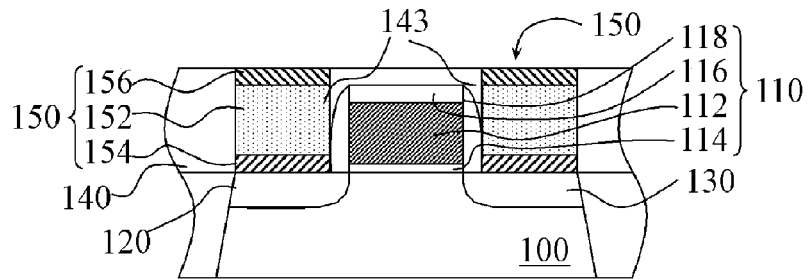
FIG. 1 shows a schematic structure of a phase-change multi-level memory cell (MLC) according to an embodiment of the present invention.

FIG. 1 shows a schematic structure of a phase-change multi-level memory cell (MLC) according to an embodiment of the present invention. The phase-change MLC comprises a semiconductor substrate 100, a gate structure 110, two source/drain regions 120 and 130, and two phase-change storing units 150. The semiconductor substrate 100, for example, can be a P-type single crystal silicon substrate. The gate structure 110, for example, comprises a gate 112, a gate dielectric layer 114 between the gate 112 and the semiconductor substrate 100, a cap layer 116 on the gate 112, and a spacer 118 located on side walls of the gate 112 and the cap layer 116. The cap layer 116 and the spacer 118 are used to prevent a short circuit between the phase-change storing units 150. In addition, the two source/drain regions 120 and 130 are located at two sides of the gate structure 100 within the semiconductor substrate 100.

The phase-change storing units 150 can be located within openings 143 formed in the dielectric layer 140 above the source/drain regions 120, 130. For example, the phase-change storing units 150 can be a stacked structure of a lower electrode 154, a conductive phase-change material layer 152 and an upper electrode 156. The material of the lower electrode 154, for example, can be refractory metal such as tungsten, which can be formed from reaction between the metal and silicon atoms on the surfaces of the source/drain regions 120 and 130. The material of the conductive phase-change material layer 152 can be a chalcogenide phase-change material, such as $Ge_2Sb_2Te_5$. The material of the upper electrode 156 can be refractory metal such as titanium-tungsten alloy (WTi), for example.

In the aforementioned memory cell, any one of the phase-change storing units 150 can be programmed to one of many phases having different resistances. Different combinations of phases/resistances of the two phase-change storing units generate different read currents, and these read currents correspond to $2^n$ n-bit data values ($n \geq 2$). A method of programming any one of the phase-change storing units 150 is described as follows.

Figure 2:
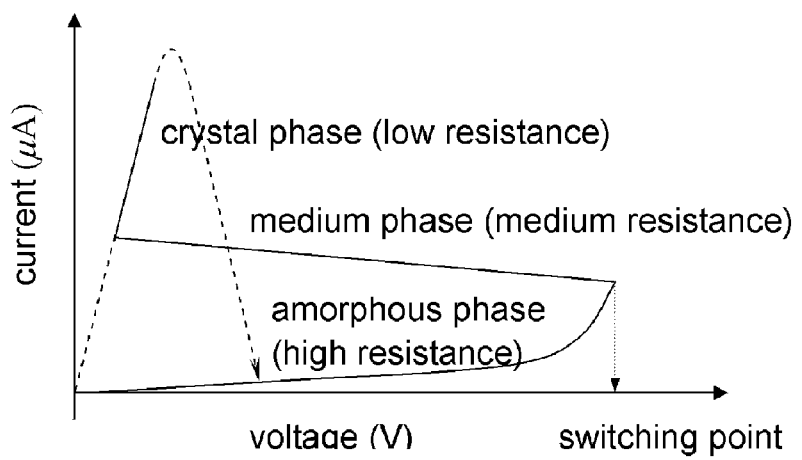
FIG. 2 shows a phase diagram of a chalcogenide phase-change material.

First, a phase change mode of a chalcogenide phase-change material is discussed. As shown in FIG. 2, when the chalcogenide phase-change material is initially in a high resistance amorphous phase, the current rises as the applied voltage increases. Then, when the voltage reaches a switching point, the I-V curve moves backwards, so that the chalcogenide phase-change material is gradually changed to a low resistance crystal phase. The phase between the switching point and crystal phase is referred as a medium phase, also as a mixed phase of the crystal phase and the amorphous phase. The resistance of the mixed phase is between the resistances of the crystal phase and the amorphous phase, and reduces as a ratio of the crystal phase to the amorphous phase increases. In contrast, when the chalcogenide phase-change material is initially in a low resistance crystal phase, the current rapidly rises as the applied voltage increases and the chalcogenide phase-change material is rapidly changed to a high resistance amorphous phase, as shown by the dotted line arrow.

Figure 3:
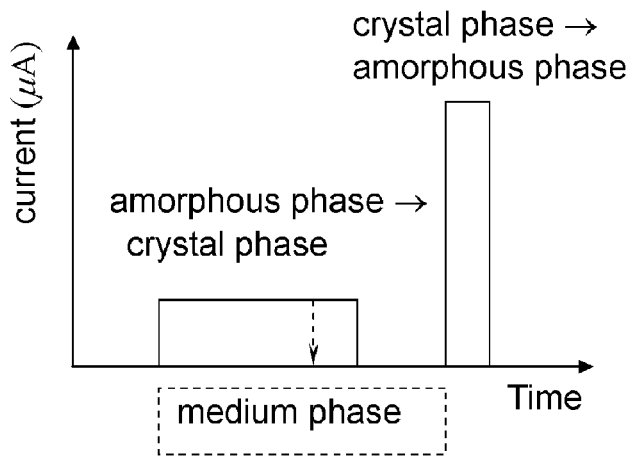
FIG. 3 is a schematic diagram showing a method of programming a phase-change storing unit of a phase-change multi-level memory cell according to one embodiment of the present invention.

Referring to FIG. 3, as described above, if the amorphous-phase conductive phase-change material layer is to be programmed to the crystal phase, the temperature of the amorphous-phase conductive phase-change layer can be slowly increased and cooled by having a weaker current pass through the conductive phase-change material layer in a long period, to gradually change to the crystal phase. In contrast, if the crystal-phase conductive phase-change material layer is to be programmed to the amorphous phase, the temperature of the crystal-phase conductive phase-change layer can be rapidly increased and cooled by having a large current pass through the conductive phase-change material layer in a short period, to gradually change to the amorphous phase.

In addition, if the amorphous conductive phase-change material layer is to be programmed to the medium phase, a width of a current pulse is shorter than a width of a current pulse used to change the amorphous phase to the crystal phase, so that the conductive phase-change material layer stays at the medium phase. However, as shown in FIG. 2, if the crystal-phase conductive phase-change material layer is to be programmed to the medium phase, a narrow and high current pulse has to be used first to change the conductive phase-change material layer to the amorphous phase, and then to the medium phase by using a wide and short current pulse.

Furthermore, if a resistance difference between the crystal phase and the amorphous phase is large enough and a read circuit has a sufficient precision, one or more the medium phases having different resistances between the crystal phase and the amorphous phase can be selected. Therefore, the medium phase together with the amorphous and the crystal phases can be combined to provide more data values for more bits.

Figure 4:
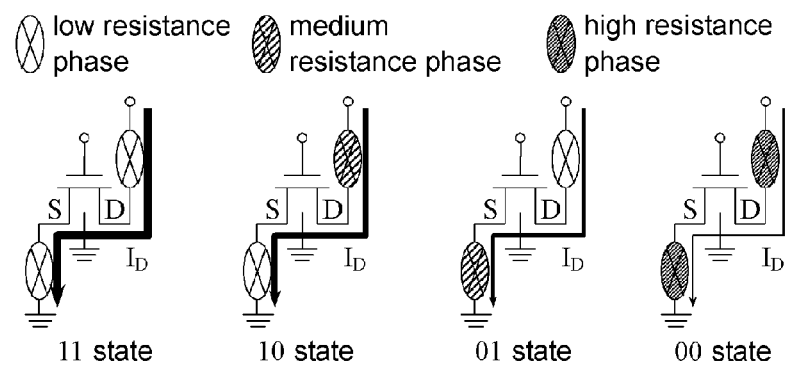
FIG. 4 shows four data storage phases of a phase-change 2-bit memory cell and a comparison of read currents during a read operation according to an embodiment of the present invention.

A two-bit MLC is described as an example in the following. FIG. 4 shows four data storage states of a phase-change 2-bit memory cell and a comparison of read currents during a read operation according to an embodiment of the present invention. As shown in FIG. 4 and Table 1, any one of the phase-change storing units can be programmed to one of high, medium or low resistance phases. Also, there are four combinations of phases of the two phase-change storing units, i.e., a low—low, a medium-low, a low-medium and a high—high resistance phases. The four resistance phases can provide four different drain currents ($I_D$, i.e., the drain current) corresponding to four 2-bit data values.

In the above four combinations, the low—low resistance phase has the largest drain current ($I_D$), and the high—high resistance phase has the smallest drain current ($I_D$). The currents of the medium-low and the low-medium resistance phases depend on the current direction. When the current direction is from right to left as shown in FIG. 4 (right S/D drain current $I_D$), the electrons flow from left to right. Therefore, the drain current for a combination of right phase-change storing unit having medium resistance and left phase-change storing unit having low resistance is higher than that of a combination of right phase-change storing unit having low resistance and left phase-change storing unit having medium resistance. When current direction is from left to right (left S/D drain current $I_D$), the drain current for a combination of right phase-change storing unit having low resistance and left phase-change storing unit having medium resistance is higher. Therefore, a preferred current direction for reading is from right to left, so that current values of storage states of 11, 10, 01 and 00 are sorted proportional to the data values.

TABLE 1

| storage state | resistance right PU* | left PU* | read current (ID) right S/D | left S/D |
|---|---|---|---|---|
| 11 | low | low | high | high |
| 10 | medium | low | medium | low |
| 01 | low | medium | low | medium |
| 00 | high | high | ≈0 | ≈0 |

*left/right PU: left/right phase-change storing unit

Figure 5:
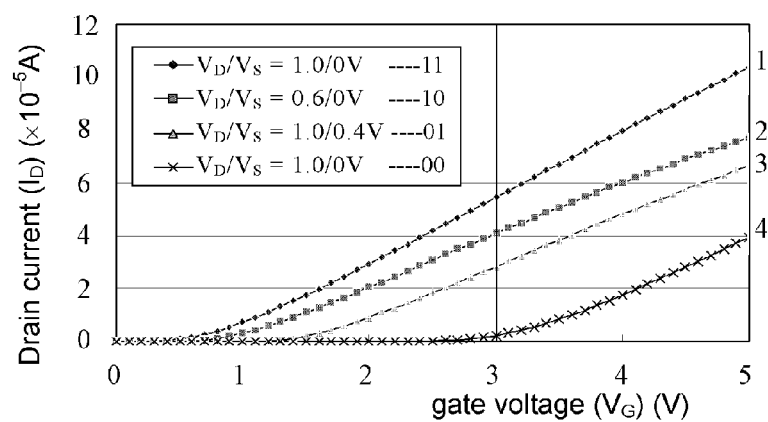
FIG. 5 is a curve showing a variation of gate voltage vs. drain current for the four storage phases of the 2-bit memory cell.

In addition, FIG. 5 is a curve showing a variation of gate voltage vs. drain current for the four storage states of the 2-bit memory cell. As shown in FIG. 5, a gate voltage of 3V for reading can precisely distinguish current values that are corresponding to the four data storage states 11, 10, 01 and 00.

Since the multi-level memory cell of the present invention uses the combinations of the phases/resistances of the two phase-change storing units to change the body effect and the read current of the memory cell and each phase-change storing unit has varying phases/resistances, one memory cell can store data values having at least two bits. The data storage density is at least twice of that in the conventional single-level phase-change memory cell.

While the present invention has been described with embodiments, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A phase-change multi-level memory cell, comprising:
a semiconductor substrate;
a gate structure, located on the semiconductor substrate;
two source/drain regions, located at two sides of the gate structure within the semiconductor substrate; and
two phase-change storing units, electrically connected to the two source/drain regions, respectively,
wherein, any one of the phase-change storing units is capable of being programmed to one of many phases with different resistances, and a combination of the phases of the phase-change storing units generates different read currents corresponding to $2^n$ n-bit data values ($n \geq 2$).

2. The phase-change multi-level memory cell of claim 1, wherein one phase-change storing unit is located directly connected to one source/drain region.

3. The phase-change multi-level memory cell of claim 2, wherein each of the phase-change storing unit is a stacked structure comprising a lower electrode, a conductive phase-change material and an upper electrode, and the lower electrode is in contact with the corresponding source/drain region.

4. The phase-change multi-level memory cell of claim 3, wherein a material of the lower electrode comprises tungsten.

5. The phase-change multi-level memory cell of claim 3, wherein a material of the upper electrode comprises titanium-tungsten alloy (WTi).

6. The phase-change multi-level memory cell of claim 1, wherein a material of the phase-change storing unit comprises a chalcogenide phase-change material.

7. The phase-change multi-level memory cell of claim 6, wherein the material of the phase-change storing unit comprises $Ge_2Sb_2Te_5$.

8. The phase-change multi-level memory cell of claim 1, wherein any one of the phase-change storing unit is capable of being programmed to one of high, medium and low resistance phases, and a state of the first and the second phase-change storing units comprises four resistance phases of a low—low, a medium-low, a low-medium and a high—high resistance phases, and wherein the four resistance phases generates different read currents corresponding to four 2-bit data values.

9. The phase-change non-volatile memory cell of claim 8, wherein when the read current is set to flow from the first source/drain region to the second source/drain region, the low—low, the medium-low, the low-medium and the high—high resistance phases of the first phase-change storing unit and the second phase-change storing unit correspond to four data values of 11, 10, 01 and 00.

10. A method for operating a multi-level memory cell, the phase-change multi-level memory cell, comprising:
a semiconductor substrate;
a gate structure, located on the semiconductor substrate;
two source/drain regions, located at two sides of the gate structure within the semiconductor substrate; and
two phase-change storing units, electrically connected to the two source/drain regions respectively, wherein any one of the phase-change storing units is capable of being programmed to one of many phases with different resistances,
the method comprising:
programming the phase-change multi-level memory cell, wherein the two phase-change storing units are set to one of the phases, so that a combination of the phases of the phase-change storing units corresponds to a predetermined data value, and the predetermined data value is one of the $2^n$ n-bit data values ($n \geq 2$), and the n-bit data values correspond to a plurality of phase combinations of the two phase-change storing units and different read currents; and
measuring the memory cell current to obtain the data value stored by the phase-change multi-level memory cell when reading the phase-change multi-level memory cell.

11. The method of claim 10, wherein when reading the phase-change multi-level memory cell, the read current flows regularly from a first source/drain region of the two source/drain regions to a second source/drain region of the two source/drain regions.

12. The method of claim 10, wherein any one of the phase-change storing units is capable of being programmed to one of high, medium and low resistance phases, and the two phase-change storing units are set to one of four combinations of a low—low, a medium-low, a low-medium and a high—high resistance phases so as to correspond to a predetermined data value, and the predetermined data value is one of four 2-bit data values.

13. The method of claim 12, wherein when reading the phase-change multi-level memory cell, the read current flows regularly from a first source/drain region of the two source/drain regions to a second source/drain region of the two source/drain regions and the low—low, the medium-low, the low-medium and the high—high resistance phases of one of the two phase-change storing units connecting to the first source/drain region and the other of the two phase-change storing units connecting to the second source/drain region correspond to four data values of 11, 10, 01 and 00.

* * * * *